(12) United States Patent
Bauch et al.

(10) Patent No.: US 7,413,767 B2
(45) Date of Patent: Aug. 19, 2008

(54) GAS SUPPLY METHOD IN A CVD COATING SYSTEM FOR PRECURSORS WITH A LOW VAPOR PRESSURE

(75) Inventors: Hartmut Bauch, Weilrod (DE); Lars Bewig, Bad Gandersheim (DE); Lutz Klippe, Weisbaden (DE); Thomas Küpper, Bad Gandersheim (DE)

(73) Assignee: Schott AG, Mainz (DE)

( * ) Notice: Subject to any disclaimer, the term of this patent is extended or adjusted under 35 U.S.C. 154(b) by 317 days.

(21) Appl. No.: 11/014,488

(22) Filed: Dec. 16, 2004

(65) Prior Publication Data

US 2005/0132959 A1 Jun. 23, 2005

Related U.S. Application Data

(62) Division of application No. 10/203,191, filed as application No. PCT/EP01/00888 on Jan. 27, 2001, now abandoned.

(30) Foreign Application Priority Data

Feb. 10, 2000 (DE) ................................. 100 05 820

(51) Int. Cl.
*C23C 16/00* (2006.01)
(52) U.S. Cl. .................... 427/162; 427/255.23; 118/728
(58) Field of Classification Search .............. 427/248.1, 427/255.23, 162; 118/715, 728, 50
See application file for complete search history.

(56) References Cited

U.S. PATENT DOCUMENTS

| | | | | |
|---|---|---|---|---|
| 4,146,657 A | * | 3/1979 | Gordon | 427/109 |
| 4,393,013 A | | 7/1983 | McMenamin | 261/64.3 |
| 4,619,844 A | | 10/1986 | Pierce et al. | 427/248.1 |
| 4,718,443 A | | 1/1988 | Adney et al. | 137/8 |
| 4,917,136 A | | 4/1990 | Ohmi et al. | 137/15.04 |
| 5,186,120 A | | 2/1993 | Ohnishi et al. | 118/667 |
| 5,271,957 A | * | 12/1993 | Wernberg et al. | 427/109 |
| 5,313,982 A | | 5/1994 | Ohmi et al. | 137/597 |
| 5,456,945 A | * | 10/1995 | McMillan et al. | 427/252 |

(Continued)

FOREIGN PATENT DOCUMENTS

DE 423 63 24 9/1993

(Continued)

*Primary Examiner*—Bret Chen
(74) *Attorney, Agent, or Firm*—Baker & Daniels LLP

(57) ABSTRACT

A method for producing optical functional coatings comprising niobium, tantalum, titanium or aluminum by supplying a precursor gas of low vapor pressure in a CVD coating system. A precursor selected from the group consisting of Nb, Ta, Ti, and Al compounds having a vapor pressure is maintained within a first supply container at a first temperature $T1$ and a first pressure $p1$. Precursor vapor of the precursor is supplied from the first supply container to an intermediate storage device through a first gas line which fluidly communicates the first supply container and the intermediate storage device. A carrier gas or reaction gas is supplied to the first gas line such that a mixture of the precursor with the carrier gas or the reaction gas is provided. The mixture is maintained in the intermediate storage device at a constant second pressure $p2$ lower than the first pressure $p1$ and at a second temperature $T2$ lower than the first temperature $T1$, and the mixture is supplied from the intermediate storage device through a second gas line.

18 Claims, 3 Drawing Sheets

U.S. PATENT DOCUMENTS

| | | | |
|---|---|---|---|
| 5,480,488 A | 1/1996 | Bittner et al. | 118/667 |
| 5,516,366 A | 5/1996 | Kanno et al. | 118/715 |
| 5,585,149 A * | 12/1996 | Hirai et al. | 427/578 |
| 5,595,603 A * | 1/1997 | Klinedinst et al. | 118/715 |
| 5,614,247 A | 3/1997 | Barbee et al. | 427/8 |
| 5,660,528 A | 8/1997 | Tsunenari | 417/32 |
| 5,693,189 A | 12/1997 | Oguro et al. | 203/3 |
| 5,744,192 A * | 4/1998 | Nguyen et al. | 427/96.8 |
| 5,749,389 A | 5/1998 | Ritrosi et al. | 137/15.04 |
| 5,865,205 A | 2/1999 | Wilmer | 137/2 |
| 5,880,303 A * | 3/1999 | Choi | 556/176 |
| 5,925,189 A * | 7/1999 | Nguyen et al. | 118/726 |
| 6,007,330 A * | 12/1999 | Gauthier | 432/47 |
| 6,037,001 A * | 3/2000 | Kaloyeros et al. | 427/250 |
| 6,110,531 A * | 8/2000 | Paz de Araujo et al. | 427/255.25 |
| 6,132,515 A | 10/2000 | Gauthier | 118/715 |
| 6,471,781 B1 * | 10/2002 | Tobe et al. | 118/726 |
| 6,596,085 B1 | 7/2003 | Schmitt et al. | 118/726 |

FOREIGN PATENT DOCUMENTS

| | | |
|---|---|---|
| EP | 0 696 472 | 12/1999 |
| JP | 2-250977 | 10/1990 |
| JP | 11-117070 | 4/1999 |

* cited by examiner

GAS SUPPLY METHOD IN A CVD COATING SYSTEM FOR PRECURSORS WITH A LOW VAPOR PRESSURE

The invention relates to a gas supply method for precursors with a low vapor pressure, especially for CVD coating systems.

In modern CVD coating systems (chemical vapor deposition), more and more specialized coatings are applied to components or substrates. The coatings, which may also consist of a series of different thin layers, must satisfy very high requirements with regard to their properties. In order to achieve such properties the deposition must also be of very high quality. This includes the deposition rate as a deposition parameter, for example, which has a considerable effect on the coating quality. In CVD deposition, the deposition rate is fundamentally determined by the partial pressure of a gaseous precursor. Therefore, the partial pressure must be set very precisely and must not fluctuate.

Special coating materials are used for coating which are delivered to the coater via selected precursors. Precursors used for producing $TiO_2/SiO_2$ alternating coatings are titanium tetrachloride ($TiCl_4$) or hexamethyl disiloxane (HDMSO), for example, which, under normal conditions, have a low vapor pressure far below the atmospheric pressure. Such a low vapor pressure is usually too low for an adequate deposition rate required for industrial coating. Therefore, the precursors must be heated up to a first evaporation temperature in a supply container so as to generate an adequate vapor pressure.

In order to prevent the precursor from condensing on the way to the coater, the gas supply device must then be heated between the supply container and the coater to a second temperature, which is higher than the first evaporation temperature.

It is also known to intermediately store the precursors or the $TiCl_4$ and hexamethyl disiloxane coating materials in an intermediate storage device at a vapor pressure of approx. 50 mbar or greater so as to achieve an adequate mass flow rate through the following valves, mass flow controllers and tube systems. In order to obtain such a partial pressure, the intermediate storage device is heated up to at least 50° C. for $TiCl_4$ and 30° C. for hexamethyl disiloxane.

Furthermore, $Nb_2O_5/SiO_2$ alternating coatings can also be produced offering the advantage that they tend less toward crystallization. Moreover, $NbO_2$ can be deposited at higher deposition rates. Additionally, the coefficient of expansion of $Nb_2O_5$ is more suitable to that of $SiO_2$ than the coefficient of expansion of $TiO_2$, so that thicker alternating coatings can be produced with $Nb_2O_5$. However, for the production of $Nb_2O_5$ coatings only precursors with comparatively low vapor pressure are available whose vapor pressure under normal conditions is even far below the vapor pressure of the HMDSO and $TiCl_4$ precursors. A commercially available Nb compound with the highest vapor pressure, $NbCl_5$, will not have a pressure of 50 mbar until a temperature of approx. 170° C. is reached. The temperature dependence of the vapor pressure of $NbCl_5$ is illustrated in the bottom curve in FIG. 1. Therefore, a gas supply device for uniformly supplying a PICVD coating system with $NbCl_5$ vapor would have to be maintained at said temperature.

A gas supply device for providing precursors with a low vapor pressure with a supply container for a precursor and an intermediate storage device for buffering and mixing the vaporous precursor with other gases is known (JP 2-25 09 77 A2). The supply container is thermostatted to a first temperature T1 and the intermediate storage device is thermostatted to a second temperature T2 where the first temperature T1 is lower than the second temperature T2 so as to prevent condensation of the precursor in the intermediate storage device. A carrier gas is delivered to the supply container which transports the precursor to the intermediate storage device and from there to a reaction chamber. The gas supply device can be provided with a second supply container from which a second precursor is delivered to the intermediate storage device by means of a carrier gas so as to mix the two precursors and the carrier gas. In this device, the intermediate storage device and the equipment connected to the intermediate storage device must be maintained at the high temperature T2, which makes maintenance work time-consuming because of the required cooling down period, and the materials and equipment must be able to withstand the high temperature T2.

A type of gas supply device for precursors with a low vapor pressure, especially for a PICVD coating system, is known where a supply container for the precursor is held at a first temperature (DE 42 36 324 C 1). Also, said gas supply device has an intermediate storage device for intermediate storage of the vaporous precursor, where the intermediate storage device is connected to the supply container via a gas line. The gas with the precursor can be removed from the intermediate storage device for the PICVD coating system. In this gas supply device, the intermediate storage device is maintained at a second temperature which is higher than the first temperature of the supply container. Pressure fluctuations in the gas with the precursor caused by removals of varying mass flow rate into the PICVD coating system are largely compensated by the intermediate storage device.

For repairs or routine maintenance work on the intermediate storage device, however, the intermediate storage device and the equipment connected to said device for supplying and removing the gas have to be cooled, which is very time-consuming. This also requires the use of expensive high-temperature mass flow controllers in the area of the intermediate storage device. Moreover, in continuous removal, the maximum removable precursor mass flow is limited by the evaporation rate of the supply container which is maintained at a lower temperature.

The aim of the invention is to develop a gas supply device for a precursor with a low vapor pressure such that maintenance and repair work on an intermediate storage device can be completed easily and quickly and using cost-effective components for the intermediate storage device and its elements without having to limit the maximum achievable mass flow rate of the precursor.

The problem is solved by means of the features set forth below.

A gas supply device of the invention for precursors with a low vapor pressure has a supply container for storing a first precursor with a low vapor pressure, an intermediate storage device for intermediate storage of the first precursor evaporated in the supply container, a first gas line connecting the supply container to the intermediate storage device, and a second gas line for removing the gas from the intermediate storage device. In this embodiment, the gas supply device is also called a gas generator.

The supply container is maintained at a first temperature T1. Via the first gas line, the gas enters the intermediate storage device where it is maintained at a second temperature T2. Also, the pressure in the intermediate storage device is held at a constant pressure p2 which is lower than the pressure p1 in the supply container so that the vaporous first precursor flows into the intermediate storage device because of the higher pressure in the supply container. According to the invention, the first temperature $T1$ in the supply container is higher than the second temperature $T2$ in the intermediate storage device.

The gas removed via the second gas line on the intermediate storage device serves to supply the coaters with the gaseous first precursor. Coaters are especially CVD coating systems or the like. Precursors are also frequently called educt species, starting materials or coating material. Precursors with a low vapor pressure should be understood to mean solid or liquid coating compounds with a vapor pressure of less than 10 mbar at temperatures of 50° C., for example.

A supply container is usually a quartz flask or a high-grade steel container or the like, where the material of the container is resistant to reactions with the precursor. The intermediate storage device can also consist of quartz, high-grade steel or the like. Advantageously, the intermediate storage device is voluminous so as to buffer pressure fluctuations caused by irregular gas removal from the intermediate storage device. The optimal volume of an intermediate storage device is known from DE 42 36 324 C1 whose disclosure content is hereby incorporated.

The maximum removable mass flow from the supply container depends on the pressure $p1$. In normal operation, the gas volume of the supply container is filled with pure precursor vapor so that the pressure $p1$ is equal to the equilibrium vapor pressure of the precursor, which increases with the temperature $T1$. The maximum removable precursor mass flow from the intermediate storage device for a coater is limited by the mass flow between the supply container and the intermediate storage device.

Consequently, as the temperature $T1$ and thus the pressure $p1$ increase the maximum usable mass flow for coating can be increased.

The evaporation rate of the first precursor in the supply container depends on the temperature $T1$ and on the partial pressure of the first precursor in the supply container. The evaporation rate increases as the temperature rises. If the vaporous precursor is now removed for the intermediate storage device the precursor is very quickly replaced because of the evaporation. In the supply container, the saturation vapor pressure of the precursor is virtually maintained. Because the saturation vapor pressure depends very highly on the temperature (see FIG. 2) a minor change in the temperature $T1$ can achieve a significant change in the pressure $p1$.

Because the precursor is preferably present only in gaseous form in the intermediate storage device because of the lower pressure $p2$ in the intermediate storage device, the maximum removable mass flow in a suitable temperature interval is not limited by the lower temperature $T2$ in a suitable temperature interval of the intermediate storage device. Therefore, the setting of the temperature $T2$ is not dependent on the temperature $T1$, and the intermediate storage device and the equipment connected to the intermediate storage device have to be heat-resistant only with regard to the lower temperature $T2$, which allows the use of less expensive components, for example flow rate controllers and valves. For maintenance or repair work in the area of the intermediate storage device, the waiting period until the intermediate storage device and the equipment connected to said device have cooled down is reduced thereby.

Also, the lower temperature $T2$ at which the high volume intermediate storage device must be held contributes to saving energy. In contrast, the supply container can be small compared to the intermediate storage device and it can be integrated so as to be heat insulated in the heated area of the intermediate storage device.

Advantageously, the temperature $T2$ of the intermediate storage device is set such that the maximum partial pressure of the first precursor in the intermediate storage device is below the saturation vapor pressure of the precursor in the intermediate storage device at the temperature $T2$. This is to prevent that the first precursor condenses and remains in the intermediate storage device.

When the pressure $p1$ is more than 1.5 [times] higher than the pressure $p2$ in the intermediate storage device, a pressure difference is obtained between the supply container and the intermediate storage device where a locking of a connection between the supply container and the intermediate storage device is achieved. Then, the rate of transportation explicitly depends upon the pressure difference ($p1$-$p2$) and the conductance of the tube connection between the supply container and the intermediate storage device. In the limiting case of an ideally locked flow, the maximum mass flow is solely determined by $p1$ and the cross-section of the line at the locking point (tube end or valve opening, for example).

The locking also prevents that the precursor vapor can diffuse from the intermediate storage device back into the supply container. Using a gas mix of the precursor vapor with another gas in the intermediate storage device prevents the precursor from mixing with other gases in the supply container.

If a valve is used, for example, for adjusting the mass flow between the intermediate storage device and the supply container, its conductance can be set such that the mass flow through the valve is affected only by the pressure $p1$ on the inlet side and that it is independent of the pressure $p2$ on the outlet side (locking conditions). The pressure $p1$ is preferably twice as high as the pressure $p2$.

According to an advantageous embodiment of the gas supply device, a metering device is provided between the supply container and the intermediate storage device. The metering device is used for setting the mass flow from the supply container to the intermediate storage device. A metering device is usually a nozzle restricting the cross-section of the line, a valve for opening and closing, a metering valve with variable cross-section and the like. The metering device is used to restrict the mass flow from the supply container to the intermediate storage device. The metering device is preferably controlled, for example by means of a controller, in such a way that the mass flow increases when the pressure in the intermediate storage device falls below the constant pressure $p2$, and that the mass flow decreases when the pressure in the intermediate storage device exceeds $p2$.

The first metering device is advantageously a controllable mass flow controller so that on the one hand, control is possible via a control unit or a regulator, and on the other hand, the mass flow flowing between the supply container and the intermediate storage device can be measured.

According to another embodiment of the gas supply device, gas is discharged via a second metering device from the intermediate storage device to a gas outlet. With this arrangement, gas can be discharged continuously from the intermediate storage device. Alternatively, the second metering device can be adjusted such that when the pressure $p2$ is exceeded gas can be discharged from the intermediate storage device so as to maintain a constant pressure in the intermediate storage device. The outlet can also be used for evacuating and purging the intermediate storage device.

Advantageously, the second metering device can be a flow control valve, where the cross-section can be adjusted for discharging the gas.

According to another embodiment, the gas outlet is connected to a vacuum pump and/or cold trap. The vacuum pump evacuates the outlet side of the gas outlet to a pressure below the pressure p2 of the intermediate storage device so as to generate a pressure difference and allowing a gas discharge. Alternatively, the vacuum pump and the cold trap can be used together so that the condensable gas freezes out on the cold trap, while the non-condensable gas can be suctioned off by the vacuum pump. Using a cold trap allows that the usually expensive precursors with a low vapor pressure can be retained so as to reuse them.

According to an especially advantageous embodiment of the gas supply device, a carrier gas is delivered into the first gas line between the supply container and the intermediate storage device. The carrier gas can be an inert gas, a second precursor or a gas mix with a second precursor. Carrier gases are used in CVD processes for transporting the precursors more rapidly to the object to be coated and for removing reaction products or impurities from there. Therefore, the carrier gas transports the first precursor faster through the gas supply device, and mixing the first precursor with the carrier gas has the additional advantageous effect that as a result of diluting the first precursor its partial pressure in the intermediate storage device is lower than the total pressure p2 in the intermediate storage device. This allows another decrease in the temperature T2 in the intermediate storage device because the condensation of the precursor depends solely on the partial pressure of the first precursor and not on the total pressure in the intermediate storage device. By decreasing the partial pressure in the intermediate storage device the temperature T2 can be reduced even further. The temperature T2 is restricted by the lower limit at which the temperature-dependent saturation vapor pressure is higher than the partial pressure of the first precursor in the intermediate storage device, which prevents condensation.

In the above embodiment, a mix is stored in the intermediate storage device whose precursor concentration (or molar fraction) is set to be constant. This is ensured by setting a constant ratio between the two gas inflows (precursor and transport/reaction gas). By producing the above described locking between the supply container and the intermediate storage device and at a constant pressure p1 a defined mass flow from the supply container to the intermediate storage device is ensured. Additionally, the locking prevents the gas mix from diffusing from the intermediate storage device back into the supply container.

It is practical to supply the carrier gas after the first metering device so that the mass flow flowing through the metering device solely contains the precursor, and the carrier gas is unable to flow into the supply container via the metering device because of the pressure difference.

According to another embodiment, the carrier gas is delivered via a third metering device which is preferably a mass flow controller so that the mass inflow of the carrier gas can be controlled.

According to an especially advantageous embodiment, the mass flow of the carrier gas is set proportionally dependent on the mass flow of the first precursor from the supply container to the intermediate storage device. As a result, a mixing ratio between the first precursor and the carrier gas is defined in the intermediate storage device by means of the proportionality factor. The constant mixing ratio in the intermediate storage device allows a defined supply of the first precursor to the coater and thus finally, a uniform deposition rate.

In order to produce optical functional coatings with a niobium oxide coating, the first precursor is advantageously an Nb compound, preferably $NbCl_5$ or an Nb alcoholate, and the carrier gas is preferably $O_2$. When $SiO_2/Nb_2O_5$ alternating coatings are produced, for example, with a gas mix of $O_2$ and $NbCl_5$, the reaction gases are directly available in the intermediate storage device for depositing the $Nb_2O_5$ coating without having to use another gas as a carrier gas.

For coatings containing tantalum, $TaCl_5$ or a Ta alcoholate can preferably be used. For coatings containing titanium or aluminum, TIPT (titanium isopropylate) or $AlCl_3$ can preferably be used.

An exemplary embodiment of the invention is explained in more detail by means of the drawings, as follows.

Figure 1:
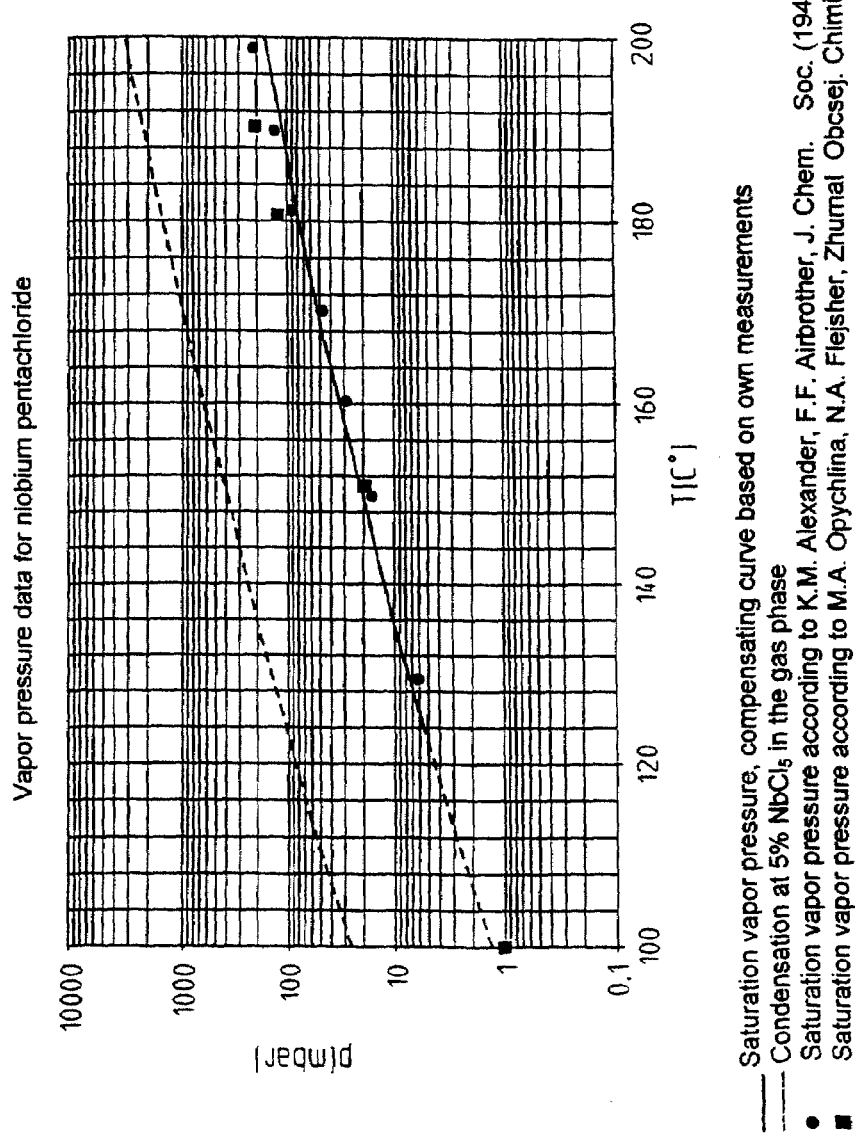
FIG. 1 is a diagram of the temperature dependence of the saturation vapor pressure of an $NbCl_5$ precursor.

The bottom curve in the diagram of FIG. 1 illustrates the course of the saturation vapor pressure of $NbCl_5$ in dependence of the temperature. Niobium pentachloride ($NbCl_5$) is present as a solid over the temperature range shown and sublimating directly into the gas phase. The bottom curve in the diagram shows the maximum saturation vapor pressure achievable by the partial pressure of $NbCl_5$ in the gas phase in equilibrium with the solid phase. At 50° C., the saturation vapor pressure is at approx. 0.04 mbar. Said pressure is too low to achieve an adequate mass flow for $NbCl_5$ in gaseous state through the tubes and valves of a gas supply system. In order to provide an adequate quantity of gas and transporting said gas through a line system the temperature, and thus the saturation vapor pressure must be increased.

The top curve in FIG. 1 shows the maximum setting for the total pressure or absolute pressure in the case where $NbCl_5$ is present in dilution with another gas to a 5% $NbCl_5$ ratio. The total pressure can then be approx. 20 times higher than the saturation vapor pressure of $NbCl_5$ before $NbCl_5$ condenses from said gas mix.

Figure 2:
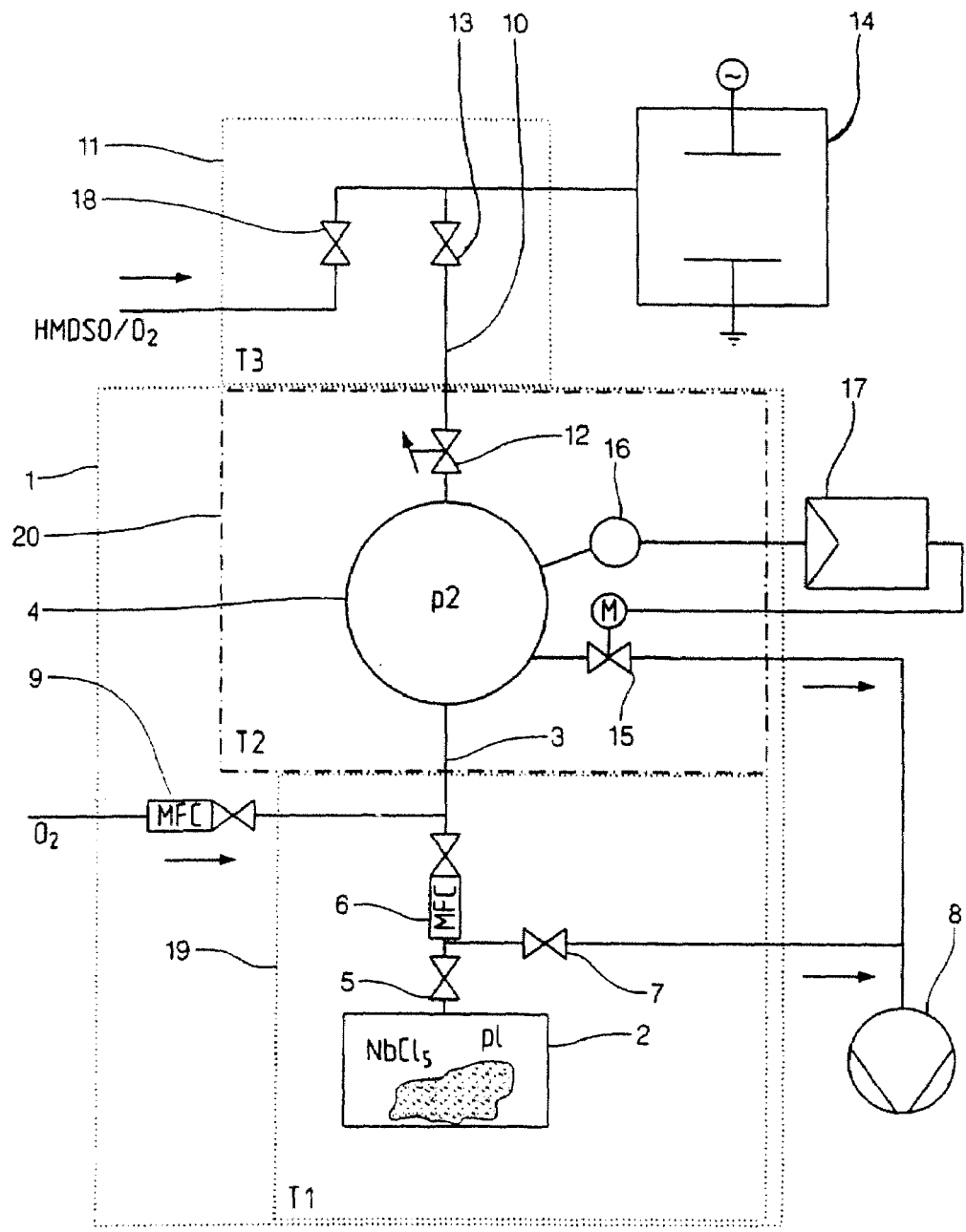
FIG. 2 is an exemplary embodiment of the gas supply device and a gas exchange station as well as a CVD deposition system.

FIG. 2 shows a diagram of a gas supply device 1 where the precursor $NbCl_5$ is stored in a supply container 2. The evaporation of the precursor generates a first pressure p1 in the supply container 2. The supply container 2 is connected via a first gas line 3 to an intermediate storage device 4. In the first gas line 3, coming from the supply container 2 a first cut-off valve 5 and a mass flow controller 6 (MFC) are disposed. With the first cut-off valve 5, the first gas line 3 can be locked relative to the supply container 2 so that the supply container 2 can be removed from the gas supply device 1 for maintenance work or for refilling the $NbCl_5$ precursor.

During the gas supply operation, the first mass flow controller 6 is used for measuring the mass flow from the supply container 2 to the intermediate storage device 4 and for adjusting the mass flow rate to a specified value.

Between the first cut-off valve 5 and the first mass flow controller 6, another gas line branches off from the first gas line 3, which can be locked by means of a second cut-off valve 7. When the cut-off valve 7 and the cut-off valve 5 are open, the supply container 2 can be evacuated by means of a forepump 8. Also, any purging gas that may have been supplied (supply not shown) can be pumped out by means of said forepump 8.

Between the first mass flow controller 6 and the intermediate storage device 4 another line enters the first gas line 3. In said line a second mass flow controller 9 is disposed. Through the second mass flow controller 9, a carrier gas or another reaction gas, in the present case oxygen ($O_2$), can be delivered into the first gas line 3. The $NbCl_5$ precursor is then mixed with the carrier gas and delivered to the intermediate storage device 4.

Via a second gas line 10 the gas or gas mix can be removed from the intermediate storage device 4 and delivered to a gas exchange station 11. Starting at the intermediate storage device 4, a first metering valve 12 and a third cut-off valve 13 are disposed in the second gas line 10 before the second gas line 10 enters a deposition system 14. When the third cut-off valve 13 is open the first metering valve 12 causes a pressure drop between the intermediate storage device 4 and the outlet side of the first metering valve 12.

Another gas line leaves the intermediate storage device 4 via a flow control valve 15 which is also connected to the forepump 8.

The pressure in the intermediate storage device 4 is measured with a pressure sensor 16. The measured pressure value is delivered to a pressure controller 17 controlling the flow control valve 15. The pressure controller 17 maintains the pressure in the intermediate storage device 4 at a specified second pressure value p2. If the pressure in the intermediate storage device 4 exceeds the specified second pressure value p2, the pressure controller 17 causes the flow control valve 15 to open and discharge excess gas to the forepump 8.

In the gas exchange station 11, behind the third cut-off valve 13, another deposition gas can alternately be delivered to the second gas line 10 from another gas line via a fourth cut-off valve 18. In the present case, the other deposition gas is a hexamethyl disiloxane-oxygen mix (HMDSO/$O_2$) for depositing $SiO_2$ coatings. Therefore, by switching the cut-off valves 13 and 18, the deposition operation can be switched from $Nb_2O_5$ deposition (from the $NbCl_5$ precursor) to $SiO_2$ deposition.

The gas supply device 1 is divided into two temperature zones. The first temperature zone is the supply area 19 comprising the supply container 2, the first cut-off valve 5, a portion of the first gas line 3, the first mass flow controller 6, the second cut-off valve 7 and a portion of the incoming and outgoing gas lines. The supply area 19 is maintained at a first constant temperature T1. It is heated by means of common heating methods. The temperature is preferably maintained constant by means of an automatic control system. As a result of the first temperature T1, the saturation vapor pressure p1 of the first precursor, in the present case $NbCl_5$, is obtained in the supply container. Heating the elements connected to the supply container 2 prevents condensation in the supply area 19.

Furthermore, an intermediate storage area 20 comprising a portion of the first gas line 3, the intermediate storage device 4, a portion of the second gas line 10, the first metering valve 12, the pressure sensor 16, the flow control valve 15 and any gas lines for purging or delivering other gases is maintained at a second temperature T2.

According to the exemplary embodiment, oxygen is supplied through the second mass flow controller 9 into the first gas line 3. Appropriate control of the mass flow controllers 6 and 9 achieves that the second mass flow controller 9 delivers a mass flow of oxygen proportional to the first mass flow controller 6. In the present case, the mass flow of the oxygen is 19 times higher than the mass flow of $NbCl_5$, resulting in a mixing ratio of 5% $NbCl_5$ gas and 95% oxygen in the intermediate storage device 4. The intermediate storage device is maintained at a total pressure of 40 mbar. The partial pressure of the $NbCl_5$ in the intermediate storage device is approx. 2 mbar, which is clearly below the saturation vapor pressure of 4 mbar at 120° C. (see FIG. 1) and which prevents condensation of $NbCl_5$.

The first temperature T1 is equal to 200° C. so that the saturation vapor pressure of $NbCl_5$ according to FIG. 1 is approx. 105 mbar and therefore p1 is approx. 100 mbar. Accordingly, a pressure difference with a factor greater than 2 exists between the supply container 2 and the intermediate storage device 4 so that the mass flow from the supply container 2 into the intermediate storage device 4 is ensured.

The pressure p2 in the intermediate storage device 4 is controlled by means of the flow control valve 15. The mass flow controllers are set for constant flow rates. Alternatively, with a fixed cross-section of the opening of the flow control valve 15 to the forepump 8, the pressure p2 is controlled via a variable control of the mass flow rates of the mass flow controllers 6, 9 at a constant ratio.

Another pressure drop is caused by the first metering valve 12 between the intermediate storage device and the gas exchange station, which further decreases the partial pressure of $NbCl_5$, and the temperature in the area of the gas exchange station can be reduced further. In the present case, it is 75° C. so that according to FIG. 1, the maximum partial pressure of $NbCl_5$ can be 0.25 mbar, and therefore the total pressure of the gas mix can be max. 5 mbar. Therefore, between the intermediate storage area 20 and the gas exchange station 11, the pressure decreases by at least a factor 8. With such a pressure drop, a locking takes place in the first metering valve 12, which means with such a pressure drop the mass flow through the first metering valve depends solely on its conductance and the pressure p2 in the intermediate storage device 4 and it is independent of the pressure in the gas exchange station 11. Therefore, in order to obtain a constant mass flow from the intermediate storage device 4 to the gas exchange station 11 and continuing to the deposition system 14, it is not necessary to provide another mass flow controller because the mass flow rate is determined via the constant pressure p2 and the conductance setting of the first metering valve.

According to another embodiment of the gas supply device, the first mass flow controller 6 can also be substituted by a metering valve corresponding to the first metering valve 12, because again, the pressure drop between the supply container 2 and the intermediate storage device 4 is greater than a factor 2. This allows that the high-temperature mass flow controller 6 can be replaced by a less expensive metering valve.

The above gas supply device 1 was described merely as an example for using the $NbCl_5$ precursor and oxygen as carrier gas. Other precursors with a low vapor pressure and other carrier gases can also be used. Examples of precursors are niobium ethoxide, aluminum trichloride, titanium isopropoxide, tantalum ethoxide. The temperatures to be set, T1 for the supply area 19, T2 for the intermediate storage area 20 and T3 for the gas exchange station can then be determined based on the curves of the saturation vapor pressure for the respective precursor allowing for the individual concentrations (molar fractions).

Figure 3:
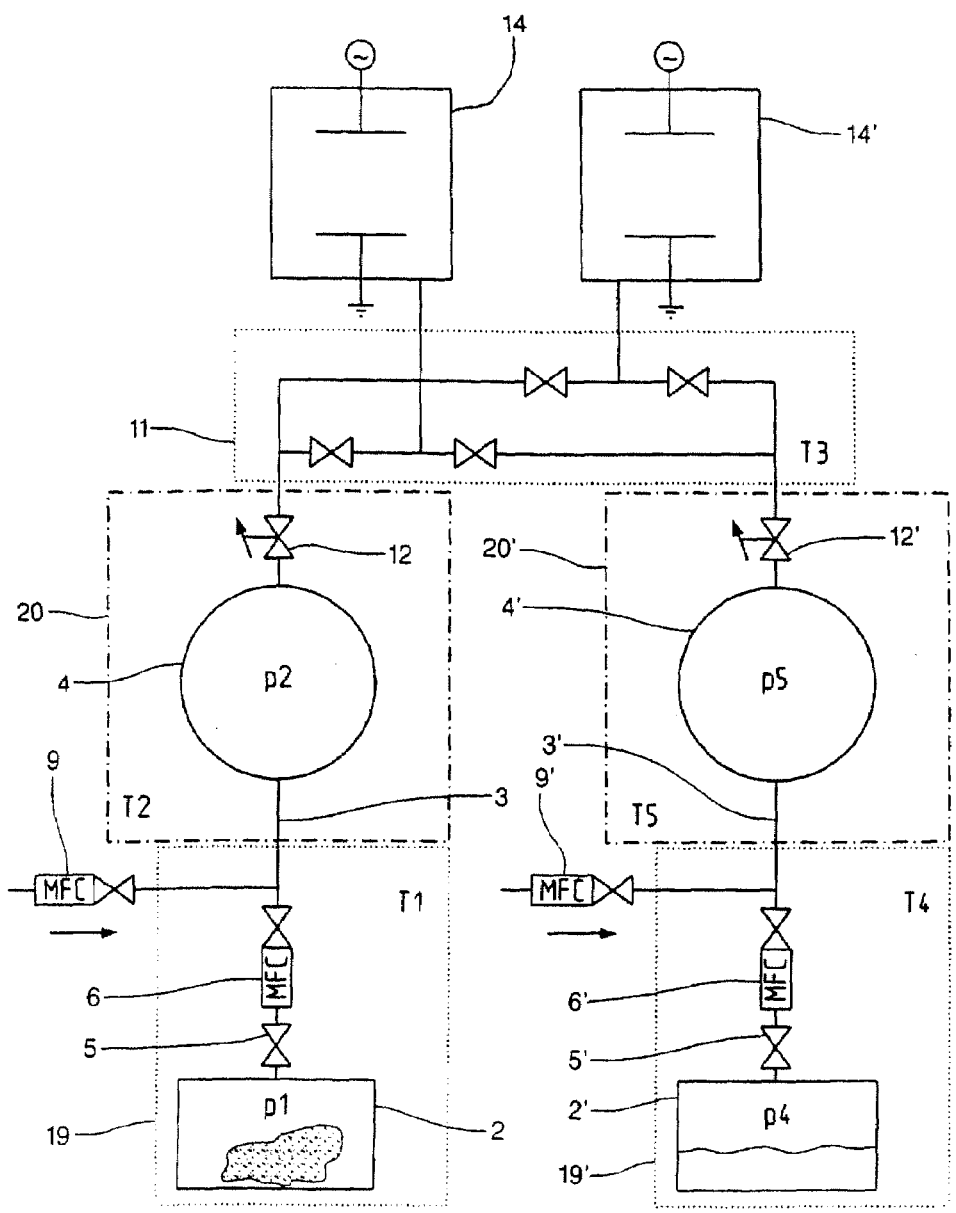
FIG. 3 is a combination of two gas supply systems with two coaters that are connected via a gas exchange station.

FIG. 3 shows a multi-chamber coating system 14, 14' which can be supplied by multiple gas supply devices 19, 20; 19', 20' via a gas exchange station 11 with two different precursors for producing alternating coatings. The reference numbers used in FIG. 2 and described above are used for identical elements in FIG. 3.

The functional method of the two gas supply devices 19, 20; 19', 20' substantially corresponds to the gas supply device 1 of FIG. 2 with the difference that the temperature T1 of the supply area 19 and the temperature T2 of the intermediate storage area 20 are optimized for the temperature dependence of the precursor in the supply container 2, and the temperature T4 in the supply area 19' and the temperature T5 in the intermediate storage area 20' are optimized for the temperature-dependent course of the vapor pressure of the second precursor in the supply container 2'.

REFERENCE LIST 1 gas supply device
2 supply container
3 first gas line
4 intermediate storage device
5 first cut-off valve
6 first mass flow controller
7 second cut-off valve
8 forepump
9 second mass flow controller
10 second gas line
11 gas exchange station
12 first metering valve
13 third cut-off valve
14 deposition system
15 flow control valve
16 pressure sensor
17 pressure controller
18 fourth cut-off valve
19 supply area
20 intermediate storage area

The invention claimed is:

1. A method for producing optical functional coatings comprising niobium, tantalum, titanium or aluminum by supplying a precursor gas of low vapor pressure in a CVD coating system, comprising the steps of:
   maintaining a precursor selected from the group consisting of Nb, Ta, Ti, and Al compounds having a vapor pressure within a first supply container at a first temperature T1 and a first pressure p1;
   supplying precursor vapor of the precursor from the first supply container to an intermediate storage device through a first gas line which fluidly communicates the first supply container and the intermediate storage device;
   supplying a carrier gas or reaction gas to the first gas line such that a mixture of the precursor with the carrier gas or the reaction gas is provided:
   maintaining the mixture in the intermediate storage device at a constant second pressure p2 lower than the first pressure p1 and at a second temperature T2 lower than the first temperature T1; and
   supplying the mixture from the intermediate storage device through a second gas line.

2. The method of claim 1, wherein said second maintaining step further comprises maintaining the second temperature T2 in the intermediate storage device such that the saturation vapor pressure of the precursor vapor is higher than its partial pressure in the intermediate storage device.

3. The method of claim 1, wherein said first maintaining step further comprises maintaining the first pressure p1 of the first precursor in the supply container at its saturation vapor pressure, such that the first precursor is in equilibrium between its liquid or solid phase and its vapor phase.

4. The method of claim 3, wherein said first maintaining step further comprises maintaining the first temperature T1 in the supply container such that the first pressure p1 is between 1.5 and 10 times higher than the second pressure p2.

5. The method of claim 4, wherein said first maintaining step further comprises maintaining the first temperature T1 in the supply container such that the first pressure p1 is approximately twice as high as the second pressure p2.

6. The method of claim 1, wherein said first supplying step further comprises adjusting the vapor mass flow of the precursor vapor from the supply container to the intermediate storage device with a first metering device disposed between the supply container and the intermediate storage device.

7. The method of claim 6, wherein the first metering device is a mass flow controller.

8. The method of claim 1, wherein said second supplying step further comprises supplying precursor vapor to a gas outlet via a second metering device.

9. The method of claim 8, wherein the second metering device is a flow control valve.

10. The method of claim 8, wherein the gas outlet is connected to at least one of a vacuum pump and a cold trap.

11. The method of claim 8, wherein said second maintaining step further comprises maintaining the constant second pressure p2 in the intermediate storage device by the second metering device.

12. The method of claim 1, wherein the first precursor is an Nb compound selected from the group consisting of $NbCl_5$ and Nb ethoxide.

13. The method of claim 1, wherein the first precursor is a Ta compound selected from the group consisting of $TaCl_5$ and Ta ethoxide.

14. The method of claim 1, wherein the first precursor is $AlCl_3$.

15. The method of claim 1, wherein the first precursor is titanium isopropylate.

16. The method of claim 1, wherein the carrier gas is one of an inert gas, a further precursor, and a mixture of an inert gas with a further precursor.

17. The method of claim 16, wherein the carrier gas is selected from the group consisting of oxygen and a gas containing oxygen.

18. The method of claim 1, wherein in said second supplying step, the precursor vapor and the carrier gas or reaction gas are mixed within the first gas line upstream of the intermediate storage device.

* * * * *